(12) United States Patent
Wang et al.

(10) Patent No.: US 12,374,596 B2
(45) Date of Patent: Jul. 29, 2025

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Wei-Ming Wang, Taichung (TW); Yu-Hung Lin, Taichung (TW); Shih-Peng Tai, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 527 days.

(21) Appl. No.: 17/827,992

(22) Filed: May 30, 2022

(65) Prior Publication Data

US 2023/0386961 A1    Nov. 30, 2023

(51) Int. Cl.
*H01L 23/34*  (2006.01)
*H01L 23/367*  (2006.01)
*H01L 23/373*  (2006.01)

(52) U.S. Cl.
CPC ...... *H01L 23/3675* (2013.01); *H01L 23/3735* (2013.01)

(58) Field of Classification Search
CPC . H01L 23/3675; H01L 23/3735; H01L 21/56; H01L 23/3121; H01L 25/0655; H01L 23/3677; H01L 23/4334; H01L 23/552; H01L 23/49827; H01L 23/5384; H01L 23/5389

USPC .......................................................... 257/712
See application file for complete search history.

(56) References Cited

U.S. PATENT DOCUMENTS

| | | | |
|---|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |

(Continued)

*Primary Examiner* — Theresa T Doan
(74) *Attorney, Agent, or Firm* — JCIPRNET

(57) ABSTRACT

A semiconductor package and a manufacturing method thereof are provided. The semiconductor package includes a substrate, a semiconductor die, a semiconductor frame structure, a semiconductor cover structure and conductive balls. The substrate has a ground plate embedded therein. The semiconductor die is disposed on the substrate and electrically connected with the substrate. The semiconductor frame structure is disposed on the substrate and surrounds the semiconductor die. The semiconductor frame structure includes conductive through semiconductor vias (TSVs) penetrating through the semiconductor frame structure, and at least one conductive TSV is electrically connected with the ground plate. The semiconductor cover structure is disposed on the semiconductor frame structure and on the semiconductor die. The semiconductor cover structure includes a conductive grid pattern and the conductive grid pattern contacts the conductive TSVs. The conductive balls are disposed on the substrate and electrically connected with the semiconductor die through the substrate.

20 Claims, 17 Drawing Sheets

(56) References Cited

U.S. PATENT DOCUMENTS 9,735,131 B2     8/2017   Su et al.
2021/0098421 A1*   4/2021   Wu ................... H01L 23/49811

* cited by examiner

SEMICONDUCTOR PACKAGE AND MANUFACTURING METHOD THEREOF

BACKGROUND

For packaging technology, the choices and the arrangement of the packaging materials relative to the packaged semiconductor dies have great impacts on the packaged products. Among various packaging materials, good heat dissipation is an important prerequisite for packaging technology.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
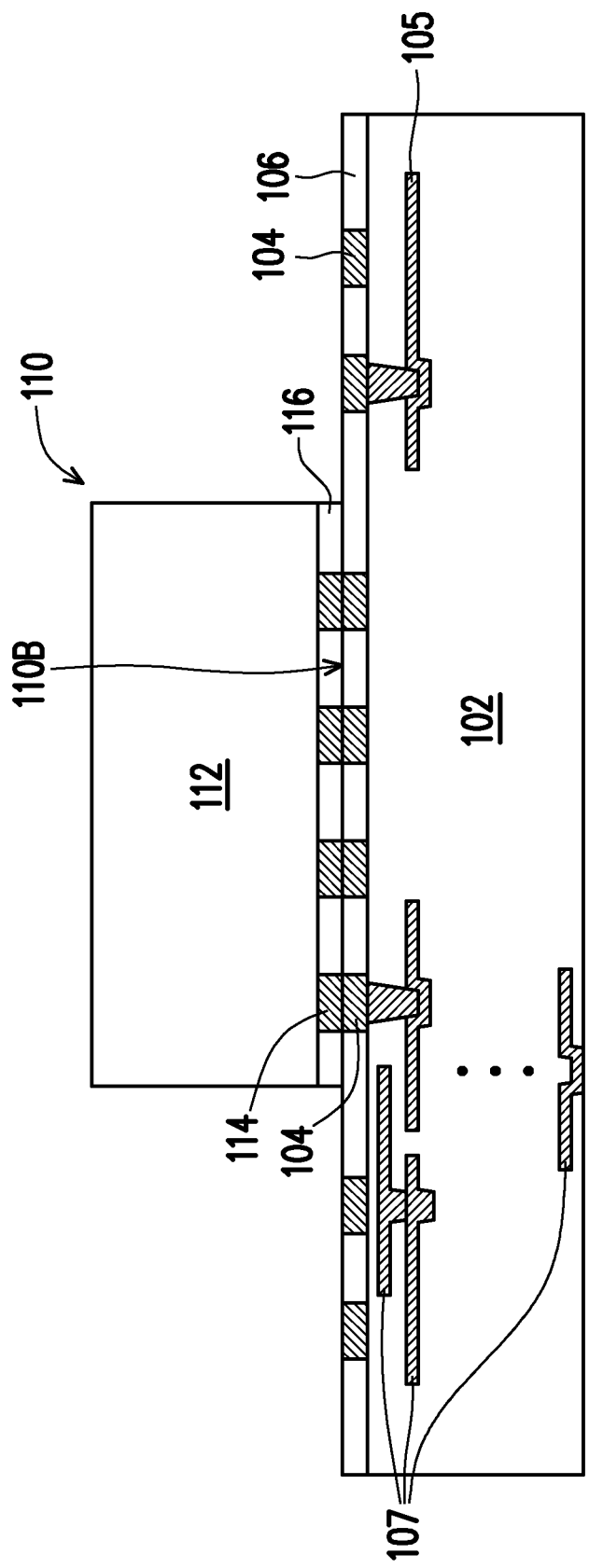
FIG. 1 through FIG. 6 are schematic cross-sectional views and three-dimensional views illustrating structures formed at various stages of a manufacturing method of a semiconductor package according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 through FIG. 6 are schematic cross-sectional views and three-dimensional views illustrating structures formed at various stages of a manufacturing method of a semiconductor package according to some embodiments of the present disclosure. FIG. 7 is a schematic cross-sectional view of a semiconductor package according to some embodiments of the present disclosure.

Referring to FIG. 1, a substrate 102 having a plurality of contact pads 104 embedded in a bonding film 106 is provided. In some embodiments, the substrate 102 is a semiconductor bulk wafer having plural semiconductor chips therein. In some embodiments, the substrate 102 may be a monocrystalline semiconductor substrate such as a silicon substrate, a silicon-on-insulator (SOI) substrate, silicon-germanium on insulator (SGOI) or a germanium-on-insulator (GOI) substrate, for example. In some embodiments, the substrate 102 includes a semiconductor substrate made of semiconductor materials, such as semiconductor materials of the groups III-V of the periodic table. In some embodiments, the semiconductor substrate includes elementary semiconductor materials such as silicon or germanium, compound semiconductor materials such as silicon carbide, gallium arsenide, indium arsenide, or indium phosphide or alloy semiconductor materials such as silicon germanium, silicon germanium carbide, gallium arsenide phosphide, or gallium indium phosphide. In certain embodiments, the substrate 102 may be a reconstituted wafer including a plurality of dies molded in a molding compound. In accordance with the embodiments, the substrate 102 include a ground plate 105 further connected with one or more contact pads 104 and conductive wirings 107 including metal lines, vias and pads for electrical connection and interconnection. It is understood that the substrate 102 may further include other conductive elements or layers, doped regions or other semiconductor components, such as active components (e.g., transistors, diodes or the like) and/or passive components (e.g., resistors, capacitors, inductors, or the like) formed therein. In some embodiments, the material of the ground plate 105 and the conductive wirings 107 includes copper or copper alloys. In certain embodiments, the contact pads 104 include metallic pads of aluminum, copper, alloys thereof or other suitable metallic material. The embodiments are intended for illustration purposes but not intended to limit the scope of the present disclosure.

Referring to FIG. 1, in some embodiments, a semiconductor die 110 is disposed on the substrate 102 and bonded to the substrate 102. In some embodiments, the semiconductor die 110 includes a semiconductor substrate 112, contact pads 114, and a bonding film 116. For example, the contact pads 114 may be formed on an active surface 110B (bottom surface) of the semiconductor die 110, and the bottom contact pads 114 are exposed from the bonding film 116. In one embodiment, the semiconductor die 110 is face-to-face bonded to the substrate 102. In some embodiments, the semiconductor substrate 112 of the semiconductor die 110 may further include active components (not shown) and conductive elements (not shown) for electrical interconnecting the active components or connecting the semiconductor die 110 to other devices or components. In certain embodiments, the contact pads 114 include aluminum pads, copper pads, or other suitable metal pads. In some embodiments, the material of the bonding film 106 or the bonding film 116 includes silicon oxide, silicon nitride, undoped silicate glass material or a suitable dielectric material. In some embodiment, the bonding film 106 or the bonding film 116 may be formed through performing a chemical vapor deposition (CVD) process such as low-pressure CVD (LPCVD), plasma enhanced CVD (PECVD), and high-density plasma CVD (HDPCVD).

In some embodiments, referring to FIG. 1, the semiconductor die 110 is bonded to the substrate 102 though hybrid bonding techniques. In some embodiments, a bonding process is performed to bond the semiconductor die 110 to the substrate 102, and the exposed contact pads 104 and 114 are bonded to each other via metal-to-metal bonding, while the bonding films 106 of the underlying substrate 102 and the bonding film 116 of the semiconductor die 110 are bonded to each other via dielectric-to-dielectric fusion bonding. In one embodiments, during the bonding process, a low temperature heating process at a temperature of about 100° C. to about 200° C. is performed to heat and bond the dielectric bonding films, and a high temperature heating process is performed at a temperature of about 200° C. to about 300° C. to heat the metallic pads such that the metallic pads are bonded and the dielectric bonding films are cured and adhered to each other.

Referring to FIG. 1, in some embodiments, as the size or span of the semiconductor die 110 is much smaller than that of the substrate 102, some contact pads 104 of the substrate 102 remain unconnected and are exposed.

In some other embodiments, it is possible that the semiconductor die(s) may be bonded to the substrate 102 though flip chip technologies using conductive connectors such as metal pillars, controlled collapse chip connection (C4) bumps, micro bumps or combinations thereof.

In some embodiments, although only one semiconductor die 110 is shown, but the number of the semiconductor die(s) may be more than one, and more than one types of semiconductor dies may be included. In some embodiments, the semiconductor die 110 is or include a logic die, such as a central processing unit (CPU) die, a graphic processing unit (GPU) die, a micro control unit (MCU) die, an input-output (I/O) die, a baseband (BB) die, or an application processor (AP) die. In some embodiments, the semiconductor die 110 may include a memory die such as a high bandwidth memory die, a dynamic random access memory (DRAM) die or a static random access memory (SRAM) die.

Figure 2:
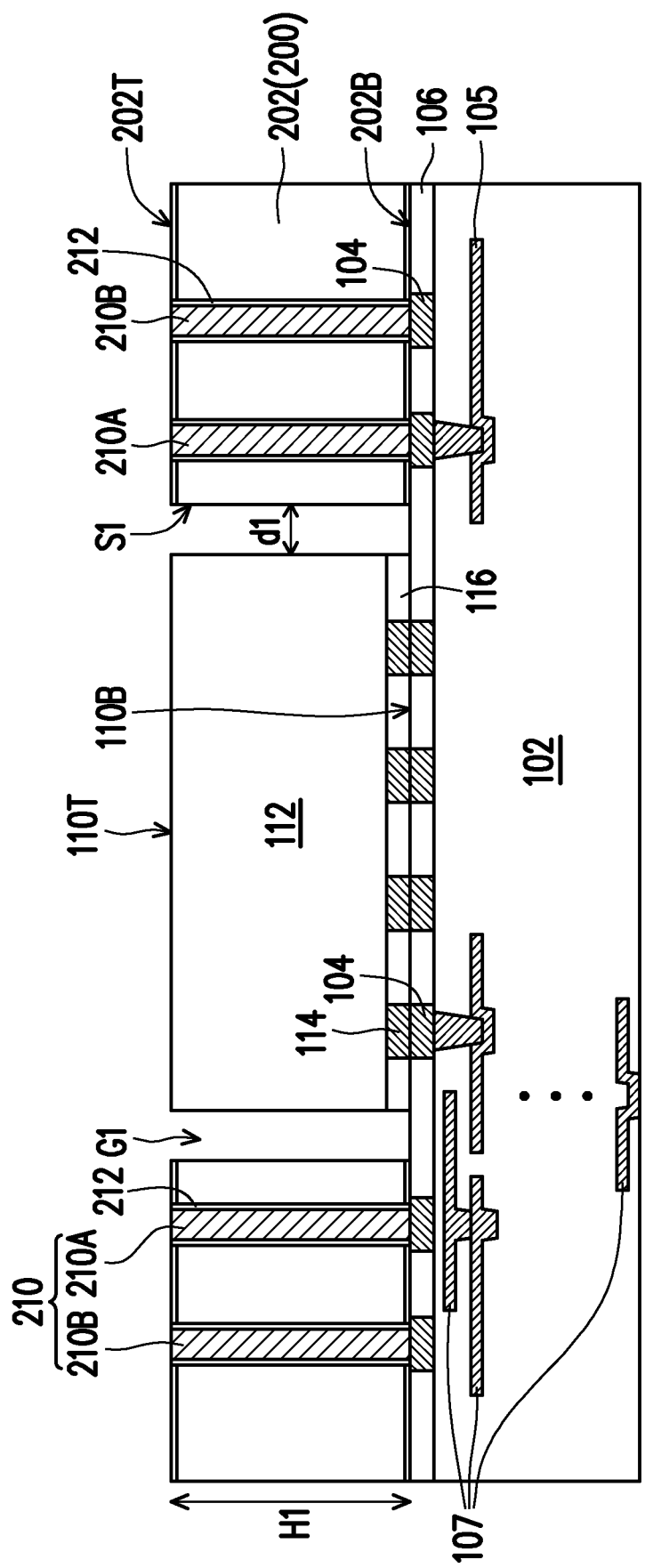
Figure 3:
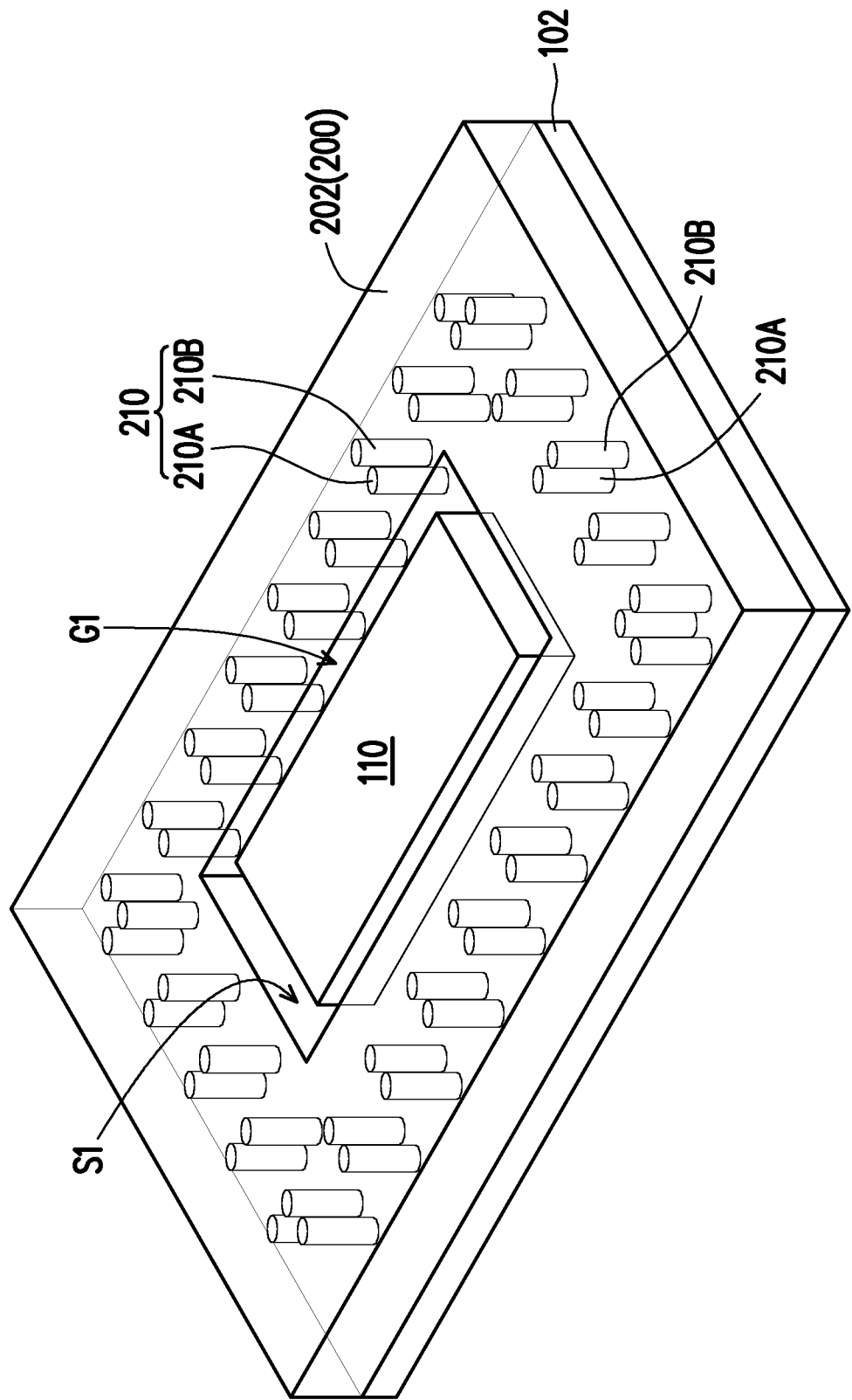

Referring to FIG. 2 and FIG. 3, in some embodiments, a semiconductor frame structure 200 is provided and mounted to the substrate 102. In some embodiments, the semiconductor frame structure 200 is bonded to the substrate 102. In some embodiments, as seen in FIG. 2 and FIG. 3, the semiconductor frame structure 200 includes a body portion 202, a plurality of via 210 penetrating through the body portion 202 of the frame structure 200 (i.e. extending from the top surface 202T to the bottom surface 202T of the body portion 202), and a through-hole S1 penetrating through the body portion 202. In some embodiments, referring to FIG. 2 and FIG. 3, when the semiconductor frame structure 200 is fixed to the substrate 102, the semiconductor die 110 is accommodated inside the through-hole S1. As the through-hole S1 is larger than the span of the semiconductor die 110, the semiconductor die 110 located inside the through-hole S1 is spaced apart from the sidewalls of the through-hole S1 (apart from the surrounding body portion 202) with a distance dl. That is, there is a ring-shaped air gap or space G1 between the semiconductor die 110 and the semiconductor frame structure 200. In some embodiments, the vias 210 are arranged surrounding the semiconductor die 110 or surrounding the air gap G1. In some embodiments, the vias 210 are arranged as pairs of inner vias 210A (located closer to the semiconductor die 110) and outer vias 210B (located farther from the semiconductor die 110), and are arranged as a ring surrounding and enclosing the semiconductor die 110 as well as the air gap G1. In one embodiment, the size (distance) dl of the air gap G1 is about 1% to about 50% of the dimension (either length or width) of the semiconductor die 110.

In some embodiments, as seen in FIG. 3, the semiconductor die 110 has a rectangular shape and the air gap G1 is in a rectangular ring shape. However, it is not limited to the shape(s) or arrangement depicted in the embodiments, the void air gap may be spaced from the long sides of the through-hole with a shorter distance and a longer distance from the short sides of the through-hole. For illustration purposes, certain materials are illustrated as transparent to shown the profiles or arrangements of the elements inlaid or embedded therein, however, the choices or properties of the materials are not limited by the schematic illustration of the drawings.

In some embodiments, the semiconductor frame structure 200 is formed by forming vias 210 with liner layers 212 in the body portion 202 and forming one or more through-holes S1 in the body portion 202. In some embodiments, a bulk semiconductor material mass (not shown) such as a silicon wafer, a germanium wafer or a SOI wafer is provided as the body portion 202, and vias 210 are formed within the semiconductor material mass and optionally a backside grinding or polishing process is performed to reveal the vias 210, and through-holes S1 are formed by patterning the body portion 202. In one embodiment, the body portion 202 may include a dielectric bonding film (not shown) for assisting later bonding. In some embodiments, the vias 210 include through semiconductor vias (TSVs). In some embodiments, the formation of the TSVs includes forming via openings (not shown) in the semiconductor material mass by deep trench etching process(es), depositing a liner material (not shown) conformal to the profile of the via openings, and forming a metal material over the semiconductor material mass and filling the via openings. The formation of the TSVs may further includes performing a planarization process to remove extra metal material and liner material outside the via openings to form the vias 210 and the liner layers 212 surrounding the respective vias 210. For example, the via openings are formed by, for example, etching (such as reactive ion etch or deep silicon etch), milling, laser drilling, or a combination thereof, the liner material is formed conformally covering the via openings by CVD or atomic layer deposition (ALD), and the conductive metal material may be formed by an electro-chemical plating process, CVD, ALD, physical vapor deposition (PVD), or combinations thereof. In some embodiments, for the vias 210, the metal material includes copper, aluminum, cobalt, tungsten, titanium, alloys, or combinations thereof, and the liner material may include silicon oxide, silicon nitride, titanium nitride, titanium oxynitride, tantalum nitride, tantalum oxynitride, tungsten nitride, or combinations thereof. In some embodiments, the liner layer 212 may be a single layer or a multi-layered structure including one or more of a seed layer, an adhesion layer and a barrier layer.

For example, the semiconductor frame structure 200 may be prefabricated through semiconductor manufacturing processes. In some embodiments, the semiconductor frame structure 200 and the substrate 102 have substantially the same or equivalent spreading span. In some embodiments, the span of the semiconductor frame structure 200 is smaller than the substrate 102. In some embodiments, the body portion 202 of the semiconductor frame structure 200 functions mainly as the support, and some or all of the vias 210 may function as electrical connection path(s) connected to the contact pads 104, and some or all of the vias 210 may function as part of an electrical shielding structure. Also, the vias 210 that are made of metal or metallic material(s) may improve the heat dissipation performance. In some embodiments, as seen in FIG. 2 and FIG. 3, the semiconductor frame structure 200 has a height (thickness) H1 substantially equivalent to the thickness of the semiconductor die 110, and the top surface 110T of the semiconductor die 110 is levelled with the top surface 202T of the body portion 202 of the semiconductor frame structure 200. In some embodiments, in FIG. 2 and FIG. 3, one end of the via 210 is exposed from the top surface 202T of the body portion 202 of the semiconductor frame structure 200, and the other end of the via 210 contacts the contact pad 104 of the substrate 102. In one embodiment, as seen in FIG. 2 and FIG. 3, the via 210 has a substantially vertical sidewall and a shape of a cylinder. It is possible that the vias 210 have tilted or slant sidewalls and each has a shape of a truncated cone. Also, it is understood that the height of the semiconductor frame structure 200 may be adjusted based on the thickness of the die(s) or the product design. It is understood that the liner layer 212 of the vias 210 may be omitted in the following figures for simplicity.

In some embodiments, the semiconductor frame structure 200 may be bonded to the substrate 102 through the vias 210 bonded to the exposed contact pads 104 and the body portion 202 bonded to the bonding film 106 by performing a bonding process. In some embodiments, the body portion 202 of the semiconductor frame structure 200 may further include a native oxide layer or a thin oxide layer on the surfaces of the body portion 202 for assisting the bonding of the frame structure to the substrate 102 or subsequently to the cover structure. As the vias 210 are bonded to the contact pads 104, at least one of the vias 210 may be further electrically connected to the ground plate 105 of the substrate 102. In some embodiments, the vias 210 function as a part of the shielding structure such as electromagnetic interference (EMI) shielding structure, and at least one of the vias 210 is electrically connected to the ground plate 105 (for grounding).

Figure 4:
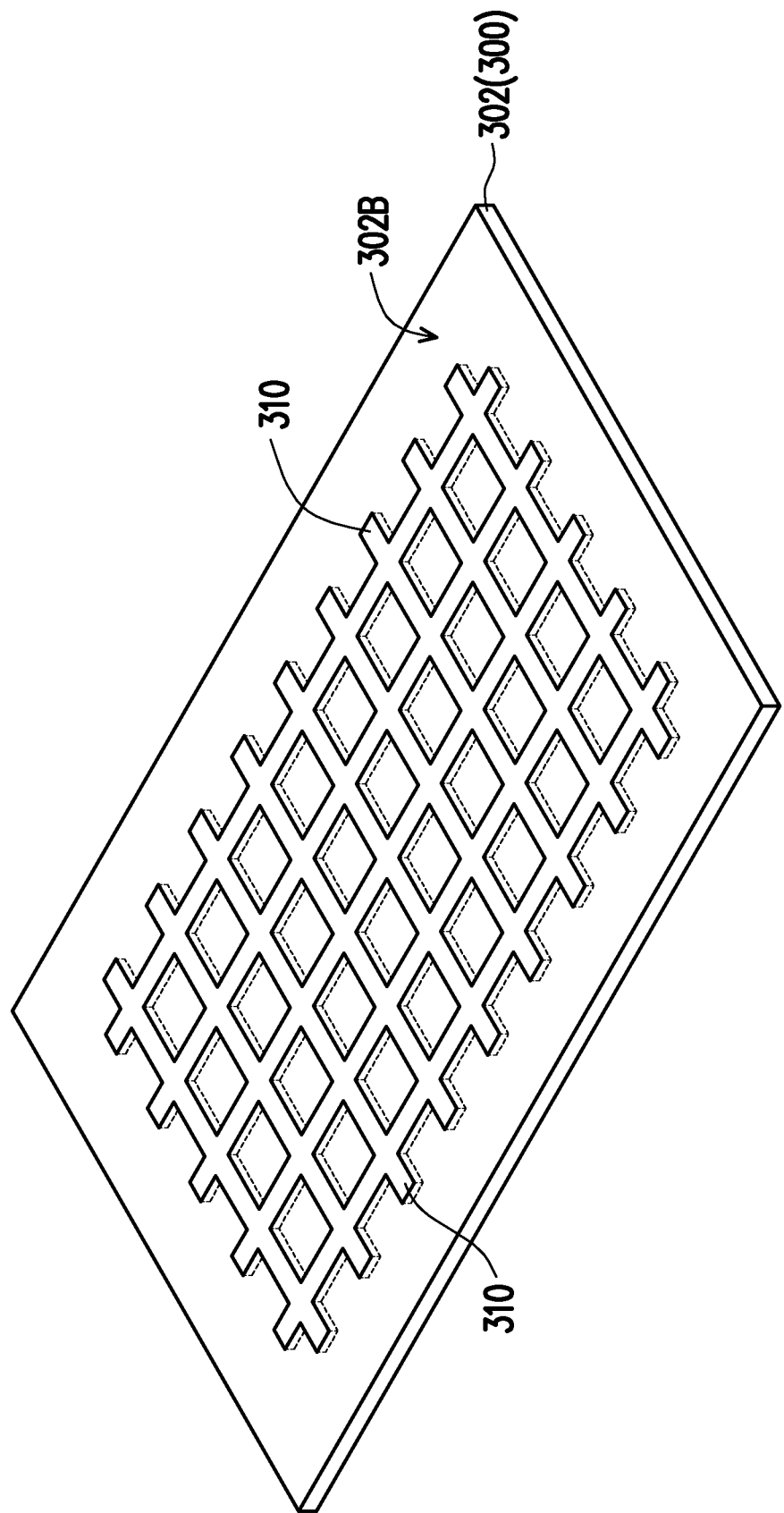

In some embodiments, referring to FIG. 4, a semiconductor cover structure 300 is provided. In some embodiments, the semiconductor cover structure 300 includes a main body portion 302 and a grid pattern 310 inlaid in the main body portion 302. For example, the semiconductor cover structure 300 may be prefabricated through semiconductor manufacturing processes. In some embodiments, the semiconductor cover structure 300 is formed by forming grid pattern 310 in the main body portion 302, and the grid pattern 310 is in the shape of a crisscross pattern. In some embodiments, a bulk semiconductor material mass (not shown) such as a silicon wafer, a germanium wafer or a SOI wafer is provided as the main body portion 302. In some embodiments, the formation of the grid pattern 310 includes patterning the bulk semiconductor material mass to form interconnected shallow trenches as openings for the later formed grid pattern by performing one or more etching process(es), depositing a liner material (not shown) conformal to the profile of the trench openings, and forming a metal material over the semiconductor material mass and filling the trench openings. The formation of the grid pattern 310 may further includes performing a planarization process to remove extra metal material and liner material. It is understood that the liner layer for the grid pattern is not shown herein for simplicity. In some embodiments, for the grid pattern 310, the metal material includes copper, aluminum, cobalt, tungsten, titanium, alloys, or combinations thereof, and the liner material may include silicon oxide, silicon nitride, titanium nitride, titanium oxynitride, tantalum nitride, tantalum oxynitride, tungsten nitride, or combinations thereof. In some embodiments, the thickness of the grid pattern 310 is smaller than the thickness of the main body portion 302. That is, the grid pattern 310 is partially exposed from the surface 302B of the main body portion 302 of the semiconductor cover structure 300.

Figure 5:
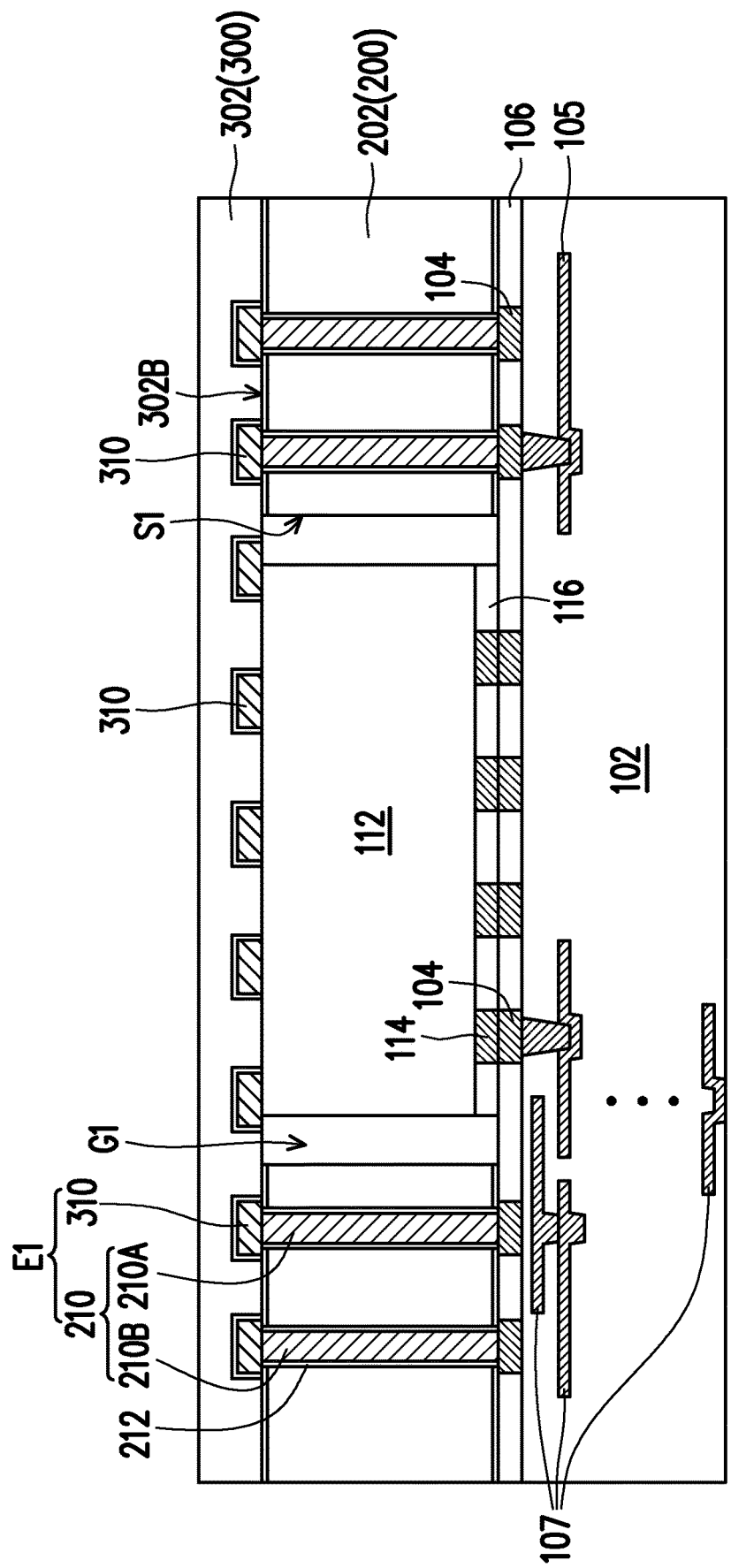
Figure 6:
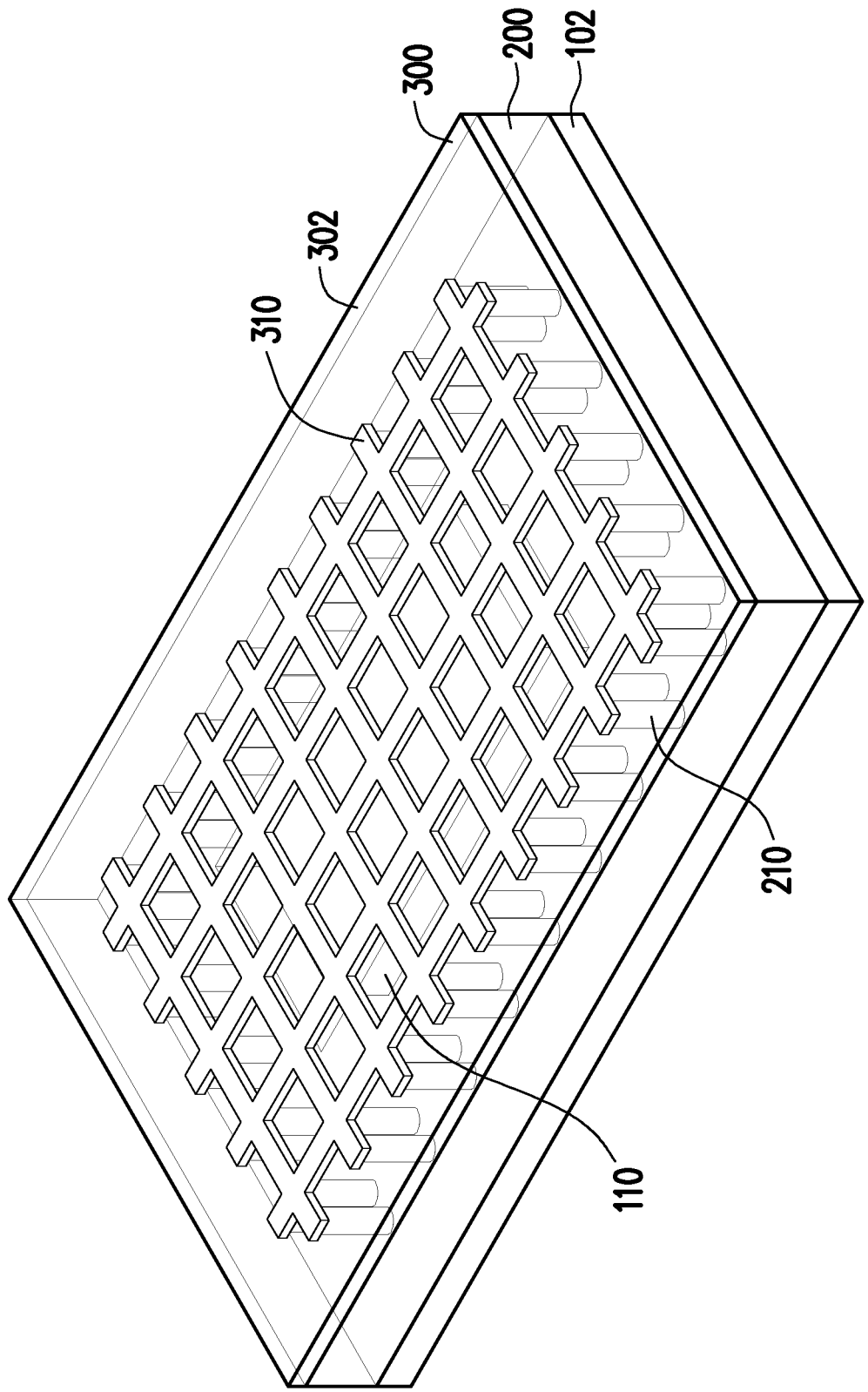
Figure 7:
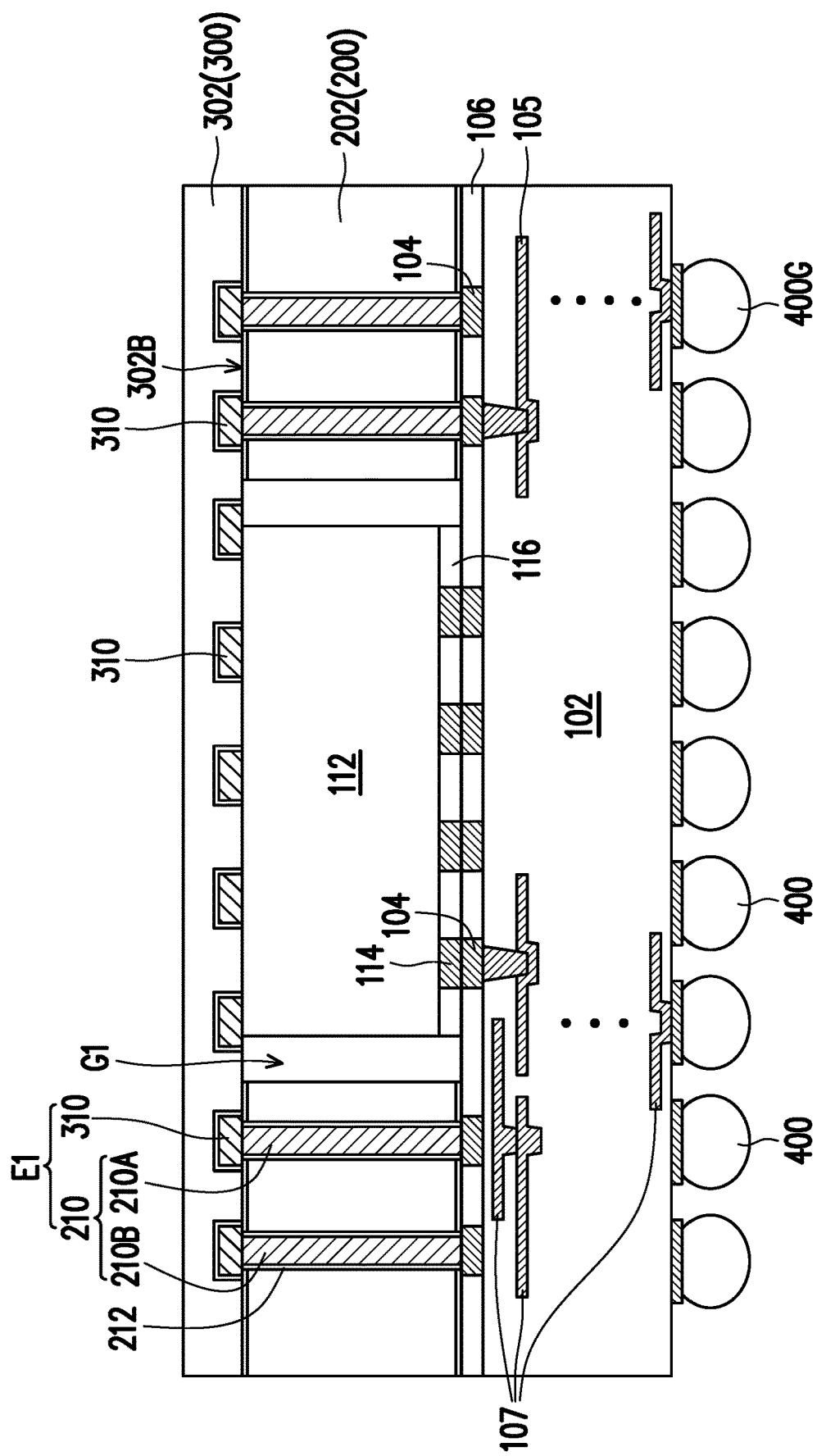
FIG. 7 is a schematic cross-sectional view of a semiconductor package according to some embodiments of the present disclosure.

Referring to FIG. 5 and FIG. 6, in some embodiments, the semiconductor cover structure 300 is mounted onto the semiconductor frame structure 200. In some embodiments, the semiconductor cover structure 300 is bonded to the semiconductor frame structure 200. In some embodiments, as seen in FIG. 5 and FIG. 6, for the grid pattern 310 that is exposed from the bottom surface 302B, a part of the grid pattern 310 is in contact with and bonded to the vias 210 of the semiconductor frame structure 200, and a part of the grid pattern 310 is in contact with the semiconductor die 110. In some embodiments, as seen in FIG. 5 and FIG. 6, the main body portion 302 is in contact with the body portion 202 of the semiconductor frame structure 200, and in contact with the semiconductor die 110. In some embodiments, after the semiconductor cover structure 300 is fixed to the semiconductor frame structure 200, the air gap G1 is sealed and defined between the die 110 and the semiconductor cover structure 300, the semiconductor frame structure 200 and the substrate 102 and surrounding the die 110. That is, the ring-shaped air gap G1 exists between the semiconductor die 110 and the semiconductor frame structure 200 and between the semiconductor cover structure 300 and the substrate 102.

In some embodiments, referring to FIG. 5 and FIG. 6, the grid pattern 310 is bonded to the vias 210 arranged surrounding the semiconductor die 110 or surrounding the air gap G1. In some embodiments, following a bonding process, the semiconductor cover structure 300 is bonded to the semiconductor frame structure 200, mainly through the grid pattern 310 bonded to the vias 210 and optionally through the bonding between similar semiconductor materials. As the grid pattern 310 is bonded to the vias 210 that are bonded to the contact pads 104, the interconnected grid pattern 310 is electrically connected with the vias 210, and the grid pattern 310 together with the connected vias 210 form a shielding structure E1. Because at least one of the vias 210 is electrically connected to the ground plate 105 of the substrate 102, the shielding structure E1 (including the grid pattern 310 and the vias 210), functioning as the EMI shielding structure, is electrically grounded. In some embodiments, the grid pattern 310 made of metal or metallic material(s) can enhance the heat dissipation efficiency and improve the heat dissipation performance. In some embodiments, the semiconductor cover structure 300 and the semiconductor frame structure 200 have substantially the same or equivalent spreading span.

Referring to FIG. 7, in some embodiments, conductive balls 400 are formed on the bottom surface of the substrate 102. In some embodiments, the conductive balls 400 include bumps, C4 bumps, ball grid array (BGA) bumps, or solder balls. In some embodiments, the conductive balls 400 are electrically connected with the substrate 102 and some conductive balls 400 are further electrically connected with the die 110 through the substrate 102. In one embodiment, at least one conductive ball 400G is electrically connected with the ground plate for grounding. The exemplary semiconductor package structure as shown in FIG. 7 may be further mounted on and connected to a circuit substrate.

FIG. 8 through FIG. 12 are schematic cross-sectional views and three-dimensional views illustrating structures formed at various stages of a manufacturing method of a semiconductor package according to some embodiments of the present disclosure. FIG. 13 is a schematic cross-sectional view of a semiconductor package according to some embodiments of the present disclosure. Herein, similar structural elements or parts or layers may be labelled with the same or similar reference labels, and may be formed with similar or substantially the same fabrication methods or materials, and the details will not be repeated for simplicity.

Figure 8:
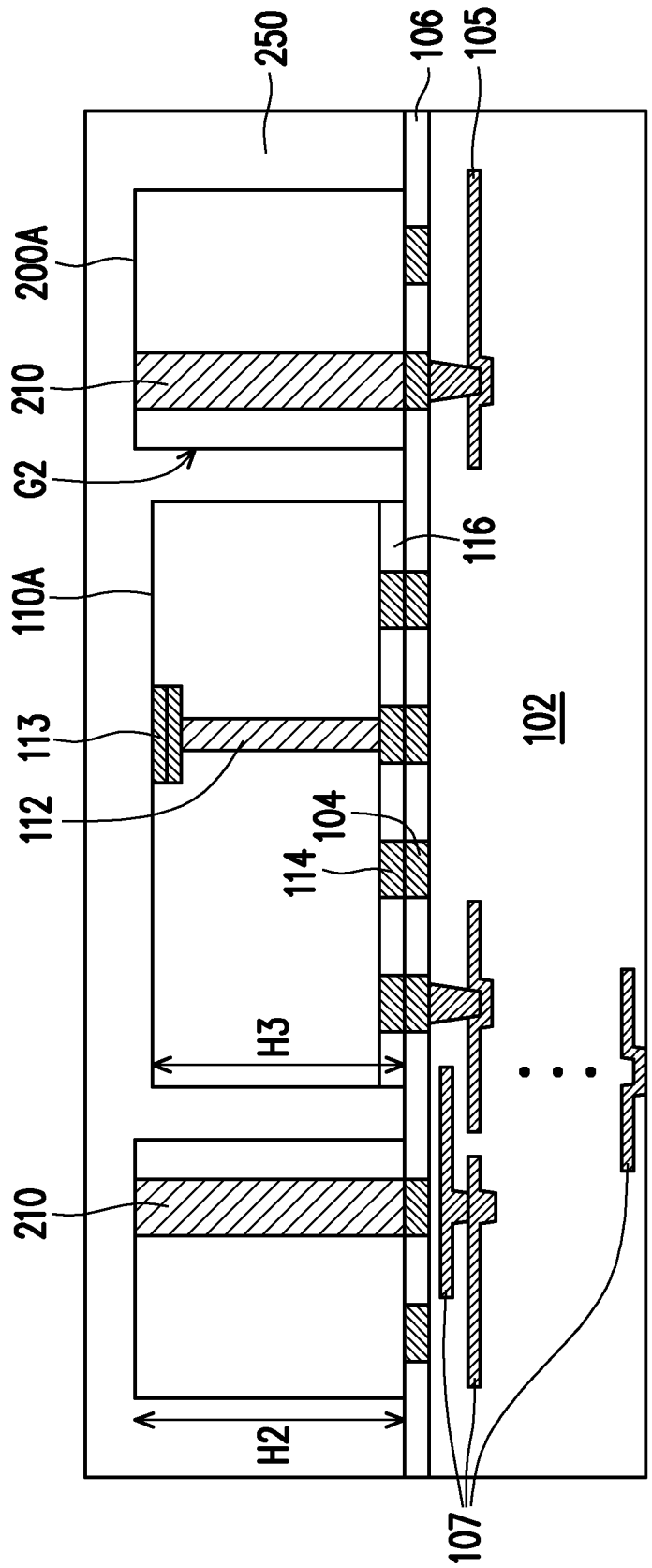
FIG. 8 through FIG. 12 are schematic cross-sectional views and three-dimensional views illustrating structures formed at various stages of a manufacturing method of a semiconductor package according to some embodiments of the present disclosure.

Referring to FIG. 8, in some embodiments, after the semiconductor die 110A and the semiconductor frame structure 200A are bonded to the substrate 102, and a space G2 is defined between the semiconductor die 110A and the semiconductor frame structure 200A, a filling material 250 is formed over the substrate 102, covering the semiconductor die 110A and the semiconductor frame structure 200A and filling up the space G2. In some embodiments, a material of the filling material 250 includes a molding compound, a molding underfill, a resin (such as an epoxy resin), an oxide filling material (such as silicon oxide or silicate glass materials) or the like. In one embodiment, the filling material 250 includes an oxide material such as silicon oxide. In some embodiments, the semiconductor die 110A is similar to the semiconductor die 110 described in the previous embodiments, except for the semiconductor die 110A including a through-semiconductor via 112 with both ends respectively connected to contact pads 113 and 104. In some embodiments, the semiconductor frame structure 200A is similar to the semiconductor frame structure 200 described in the previous embodiments, except for the semiconductor frame structure 200A having a span (area) smaller than the substrate 102 and a height H2 higher than the thickness H3 of the semiconductor die 110A. In addition, the semiconductor frame structure 200A includes vias 210 arranged as a ring circling the semiconductor die 110A but the vias 210 are not arranged as pairs.

Figure 9:
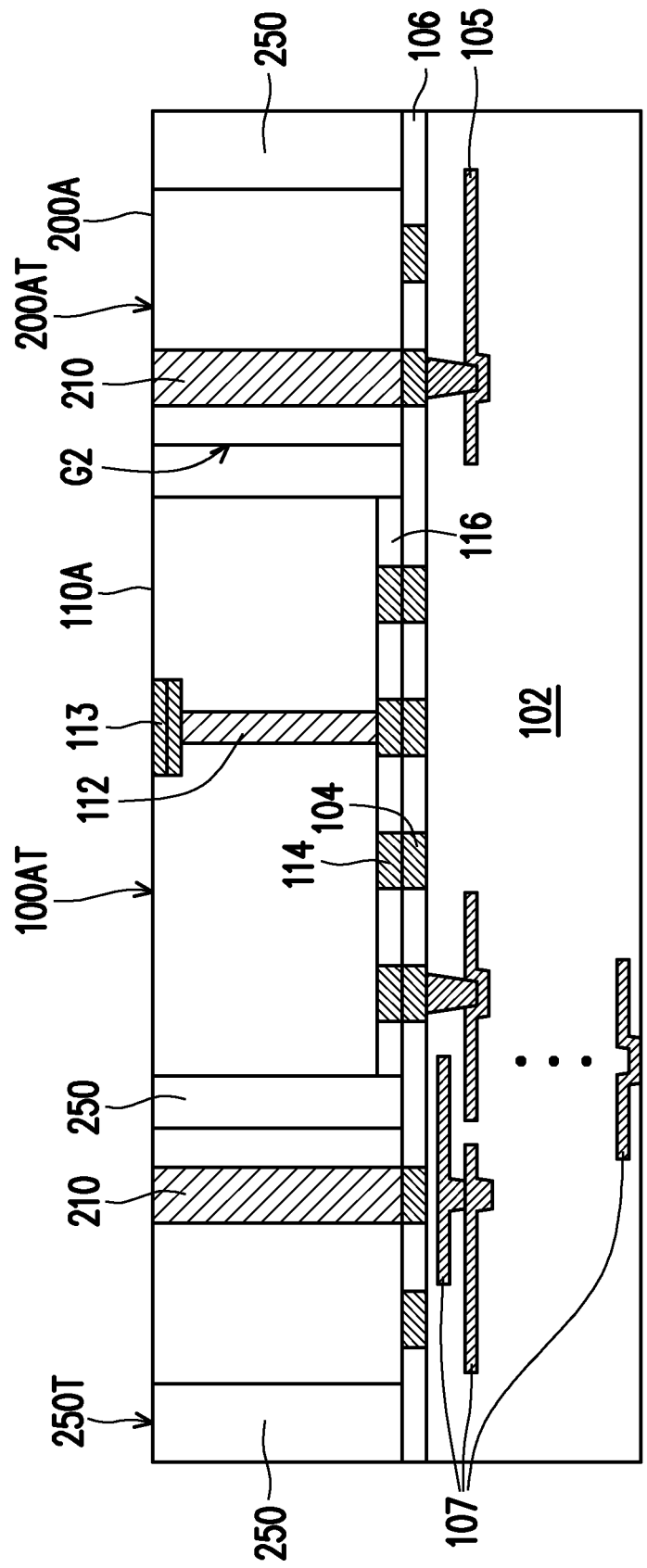
Figure 10:
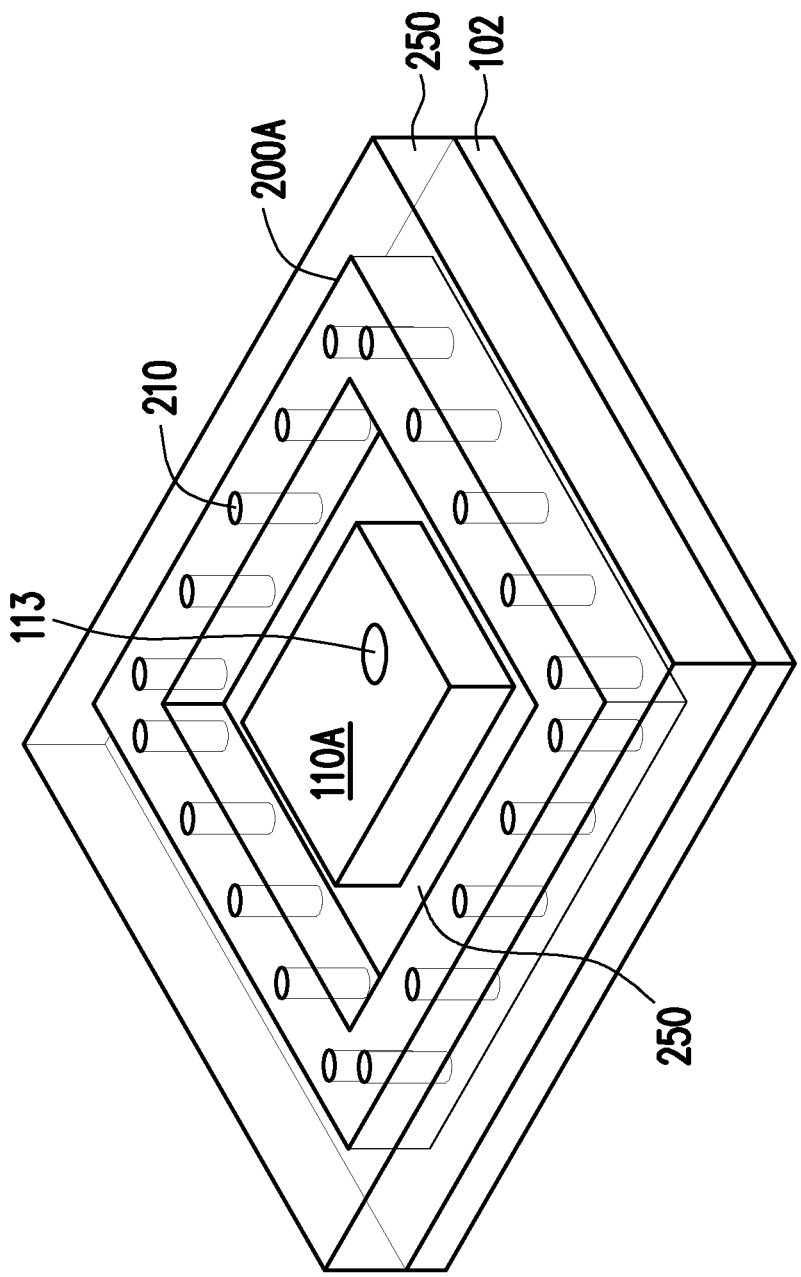

Referring to FIG. 9 and FIG. 10, a planarization process is performed to remove the extra filling material 250, so that the top surface 110AT of the semiconductor die 110A is coplanar and flush with the top surface 200AT of the semiconductor frame structure 200A and the top surface 250T of the planarized filling material 250. In some embodiments, the planarization process includes one or more of a mechanical grinding process, a chemical mechanical polishing (CMP) process or a combination thereof. In some embodiments, after the planarization process, the contact pad(s) 113 of the semiconductor die 110A is exposed, and the tops of the vias 210 are exposed. For illustration purposes, certain materials are illustrated as transparent to shown the profiles or arrangements of the elements inlaid or embedded therein.

Figure 11:
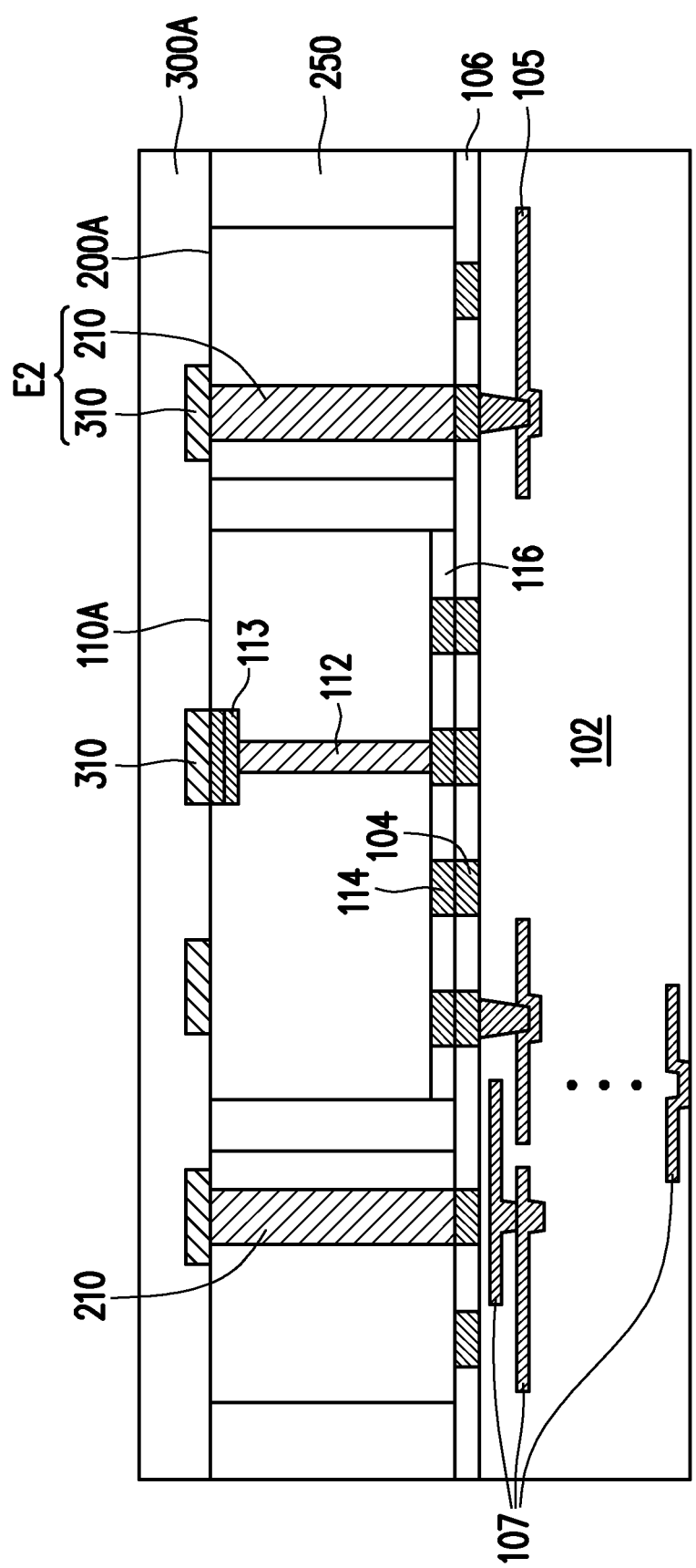
Figure 12:
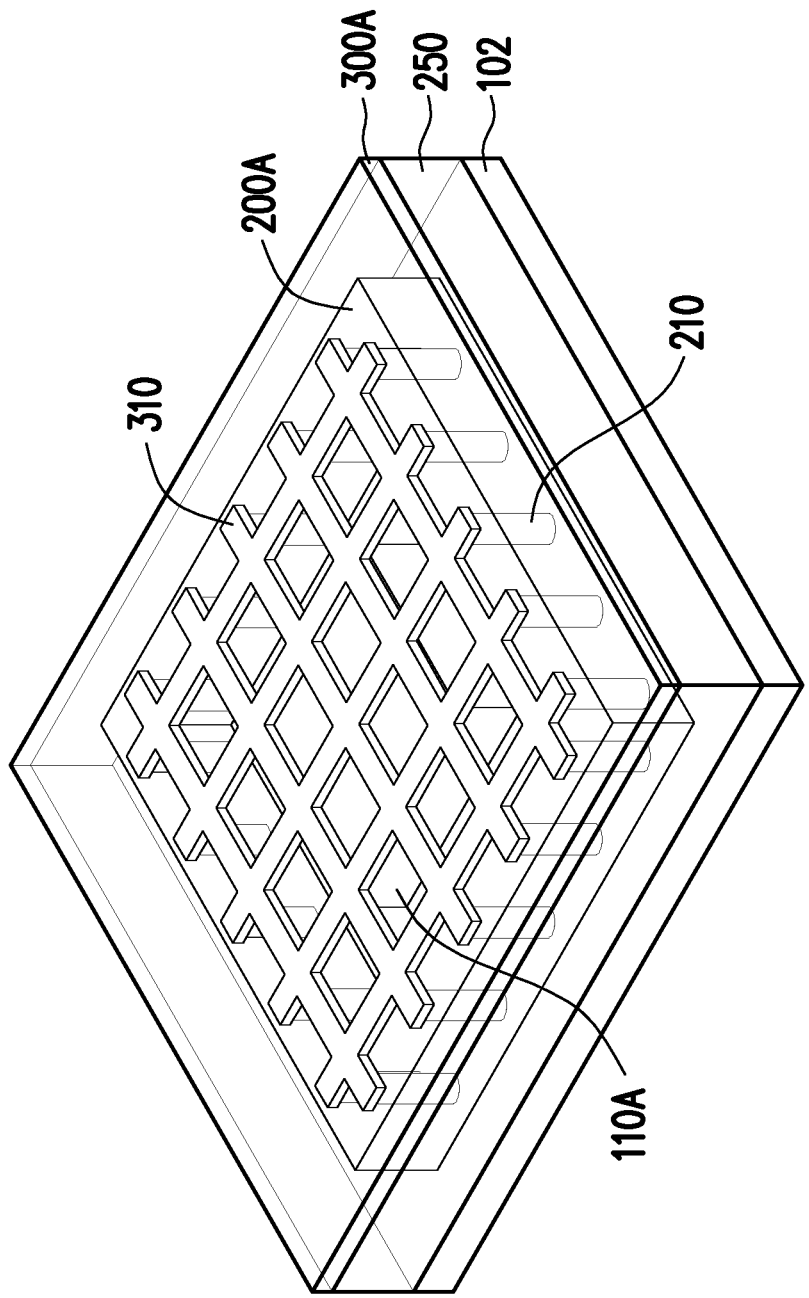
Figure 13:
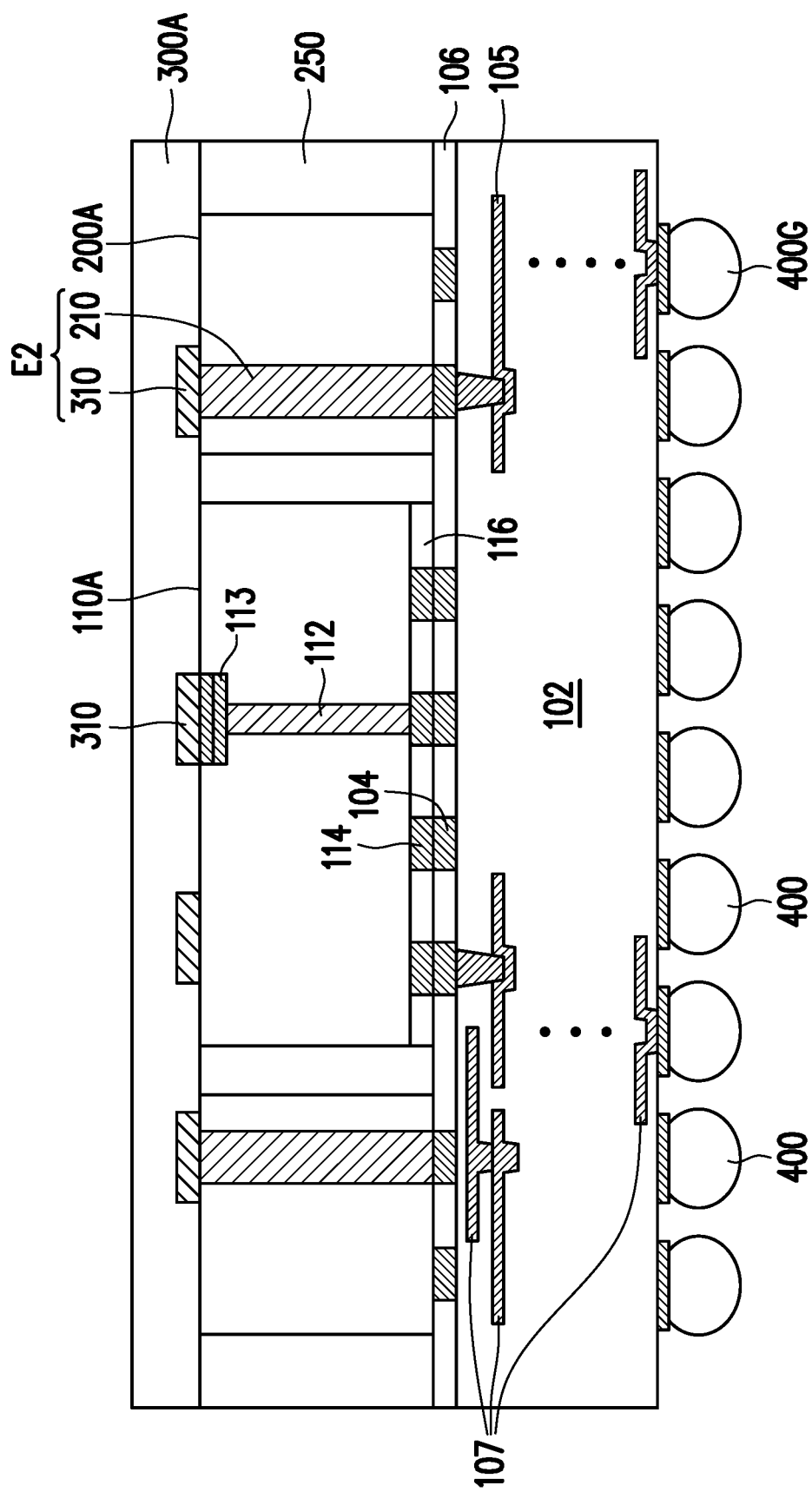
FIG. 13 is a schematic cross-sectional view of a semiconductor package according to some embodiments of the present disclosure.

Referring to FIG. 11 and FIG. 12, in some embodiments, a semiconductor cover structure 300A is mounted onto the semiconductor frame structure 200A and the planarized filling material 250 and covers the semiconductor die 110A. In some embodiments, the spreading span of semiconductor cover structure 300A is larger than the spreading span of the semiconductor frame structure 200A. In some embodiments, the semiconductor cover structure 300A is similar to the semiconductor cover structure 300 described in the previous embodiments with a grid pattern 310 having a pattern corresponding to the underlying vias 210.

In some embodiments, in FIG. 11 and FIG. 12, the semiconductor cover structure 300A is bonded to the semiconductor frame structure 200A through the grid pattern 310 bonded to the vias 210 of the semiconductor frame structure 200A. In some embodiments, the grid pattern 310 is bonded to the contact pad 113 of the semiconductor die 110A and is electrically connected with the substrate 102 through the through-semiconductor via 112 and the contact pads 104, 113. As the grid pattern 310 is bonded to the vias 210 that are bonded to the contact pads 104, the interconnected grid pattern 310 is electrically connected with the vias 210, and the grid pattern 310 together with the connected vias 210 form a shielding structure E2. Because at least one of the vias 210 is electrically connected to the ground plate 105 of the substrate 102, the shielding structure E2 (including the grid pattern 310 and the vias 210), functioning as the EMI shielding structure, is electrically grounded.

Referring to FIG. 13, in some embodiments, conductive balls 400 are formed on the bottom surface of the substrate 102, and the conductive balls 400 include bumps, C4 bumps, ball grid array (BGA) bumps, or solder balls. In some embodiments, the conductive balls 400 are electrically connected with the substrate 102 and some of the conductive balls 400 are further electrically connected with the die 110 through the substrate 102. In FIG. 13, the assembled semiconductor frame structure 200A and cover structure 300A together function as a support member, and the grid pattern 310 and the vias 210 together function as an EMI shielding structure to protect and shield the enclosed semiconductor die 110A from electromagnetic interference radiation or signals. In some embodiments, the EMI shielding structure is electrically connected with the ground plate 105 of the substrate 102 and further electrically connected to one grounding ball 400G for grounding.

Compared with metal gasket shielding structure, through using the assembled semiconductor frame structure and semiconductor cover structure, the manufacturing processes are more compatible with the semiconductor packaging processes. Also, due to the semiconductor materials used for the frame structure and the cover structure, better material matching and compatibility can be achieved, leading to less warpage and better structural integrity. Compared with directly mounting a metal/metallic gasket on the substrate or over the semiconductor die, CTE mismatch of the materials of the package structure can be alleviated, which leads to less cracking or delamination, and better reliability and yield of the package structure.

Figure 14:
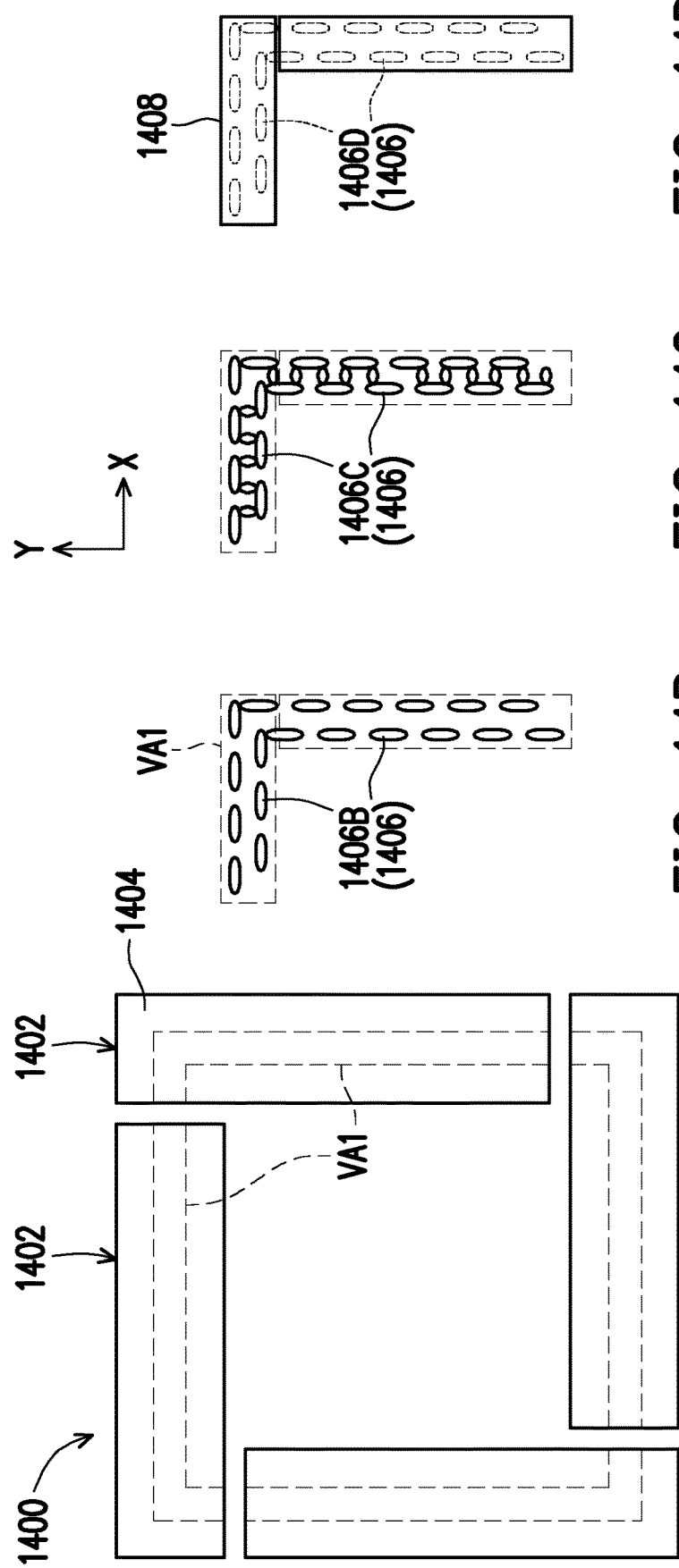
FIG. 14A and FIGS. 14B-14D respectively illustrates schematic top views of a semiconductor frame structure and portions of the frame structure according to some embodiments of the present disclosure.

FIG. 14A and FIGS. 14B-14D respectively illustrates schematic top views of a semiconductor frame structure and portions of the frame structure according to some embodiments of the present disclosure. Referring to FIG. 14A, the semiconductor frame structure 1400 may include multiple blocks 1402, and the blocks 1402 may be assembled together as a ring-shaped frame structure. Each block 1402 includes a semiconductor body portion 1404 and many vias 1406 embedded in the body portion 1404. As seen in FIG. 14A, the vias 1406 are arranged within and distributed over a via distribution region VA1. Referring to FIGS. 14B-14D, the via distribution region VA1 (marked in dotted line) may be reverse L-shaped, and the vias 1406 are arranged in two rows/columns along the borders of the via distribution region VA1. In some embodiments as seen in FIG. 14B, the vias 1406B are oval pillars arranged partially in two rows and partially in two columns, spaced apart from one another. In some embodiments as seen in FIG. 14C, in addition to the vias 1406C arranged in two rows/columns, more vias 1406C are arranged therebetween (the arrangement in a shape of square waves) and are interlinked with one another to form a chain wall structure. In some embodiments as seen in FIG. 14D, in addition to the vias 1406D arranged in two rows/columns, metal pad 1408 are formed on top of the vias 1406D to strengthen the integral structure strength. In some embodiments, the area of the metal pads 1408 are larger than the underlying vias 1406D, and one metal pad is connected with multiple vias 1406D. The formation of the metal pads 1408 involves forming dual damascene openings in the semiconductor body portion for accommodating the pads and the vias and then filling a metal material into the pad openings, and optionally performing a planarization process to remove the excess metal material. In some embodiments, the metal pads 1408 may be in various shapes such as L-shaped, rectangular, or square shape and the sizes of the metal pads 1408 may be different.

Figure 15:
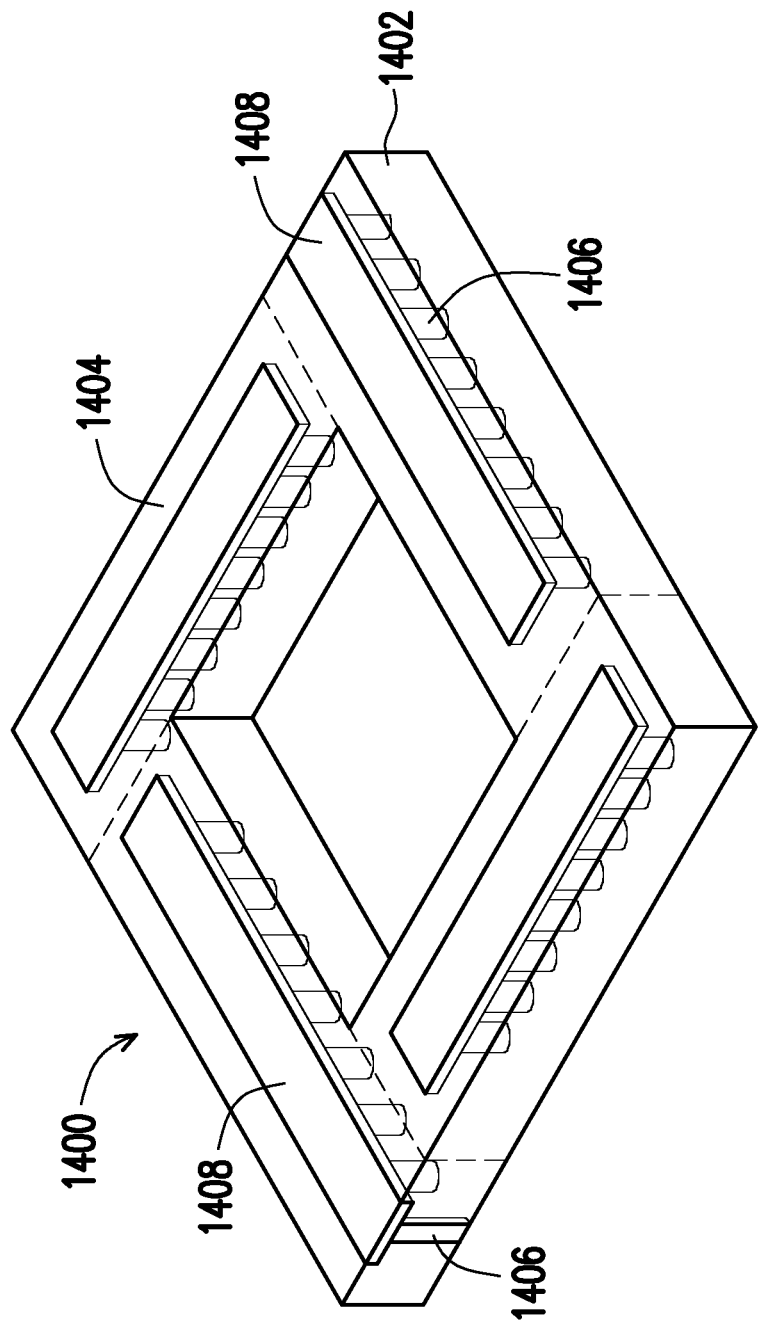
FIG. 15 illustrates a schematic 3D view of a semiconductor frame structure according to some embodiments of the present disclosure.
Figure 16:
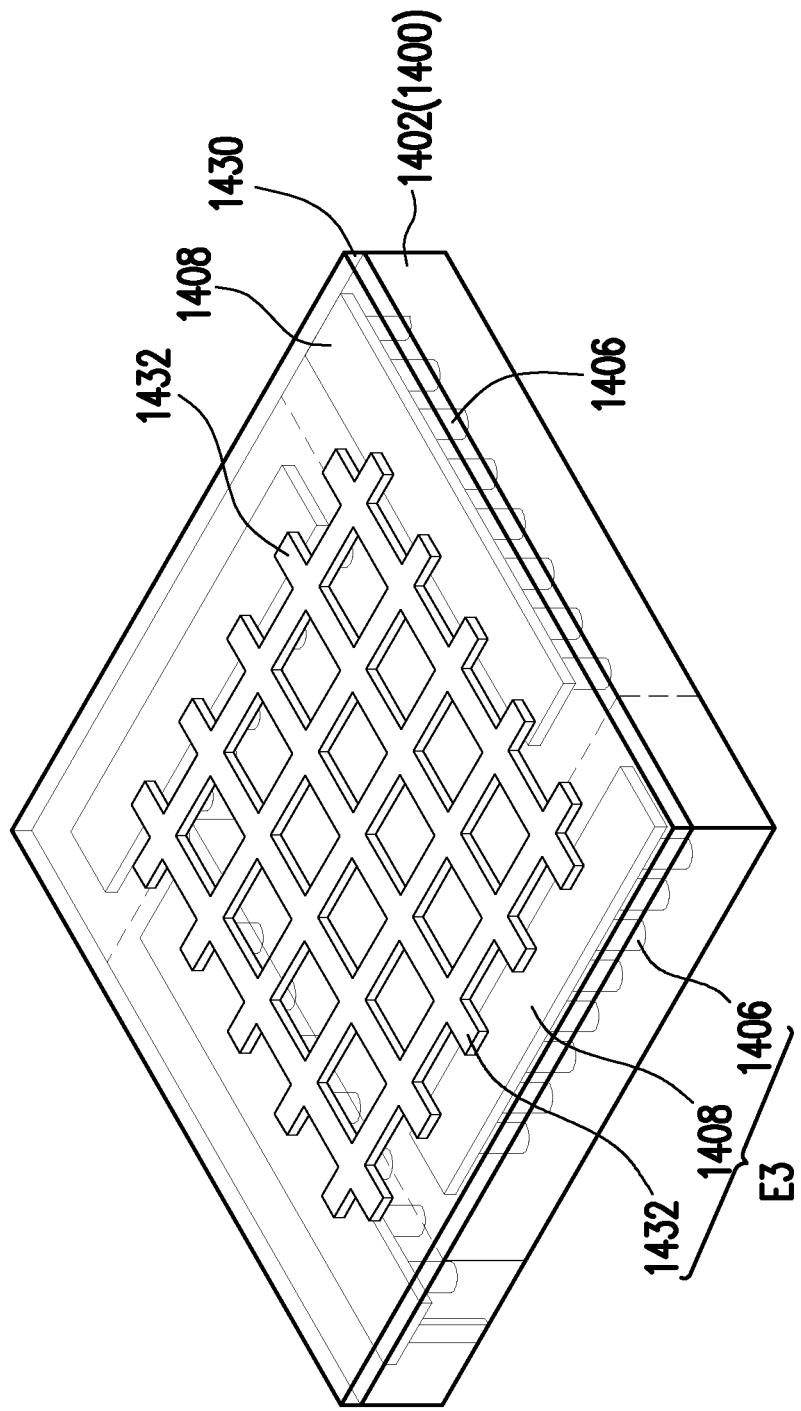
FIG. 16 illustrates a schematic 3D view of a structure having the semiconductor cover structure assembled with the semiconductor frame structure according to some embodiments of the present disclosure.

FIG. 15 illustrates a schematic 3D view of a semiconductor frame structure according to some embodiments of the present disclosure. FIG. 16 illustrates a schematic 3D view of a structure having the semiconductor cover structure assembled with the semiconductor frame structure according to some embodiments of the present disclosure.

Referring to FIG. 15, the blocks 1402 are assembled and connected with each other to form the semiconductor frame structure 1400 enclosing a space for accommodating the die(s). Referring to FIG. 15 and FIG. 16, the semiconductor cover structure 1430 is bonded to the semiconductor frame structure 1400, and the grid pattern 1432 of the semiconductor cover structure 1430 is bonded to the metal pads 1408 of the semiconductor frame structure 1400. In some embodiments, the semiconductor cover structure 1430 assembled with the semiconductor frame structure 1400 form a shielding structure E3, and the grid pattern 1432 connected with the metal pads 1408, the vias 1406 is electrically connected to the underlying substrate and grounded. In one embodiment, the grid pattern 1432 connected with the metal pads 1408, the vias 1406 form an EMI shielding structure.

Figure 17:
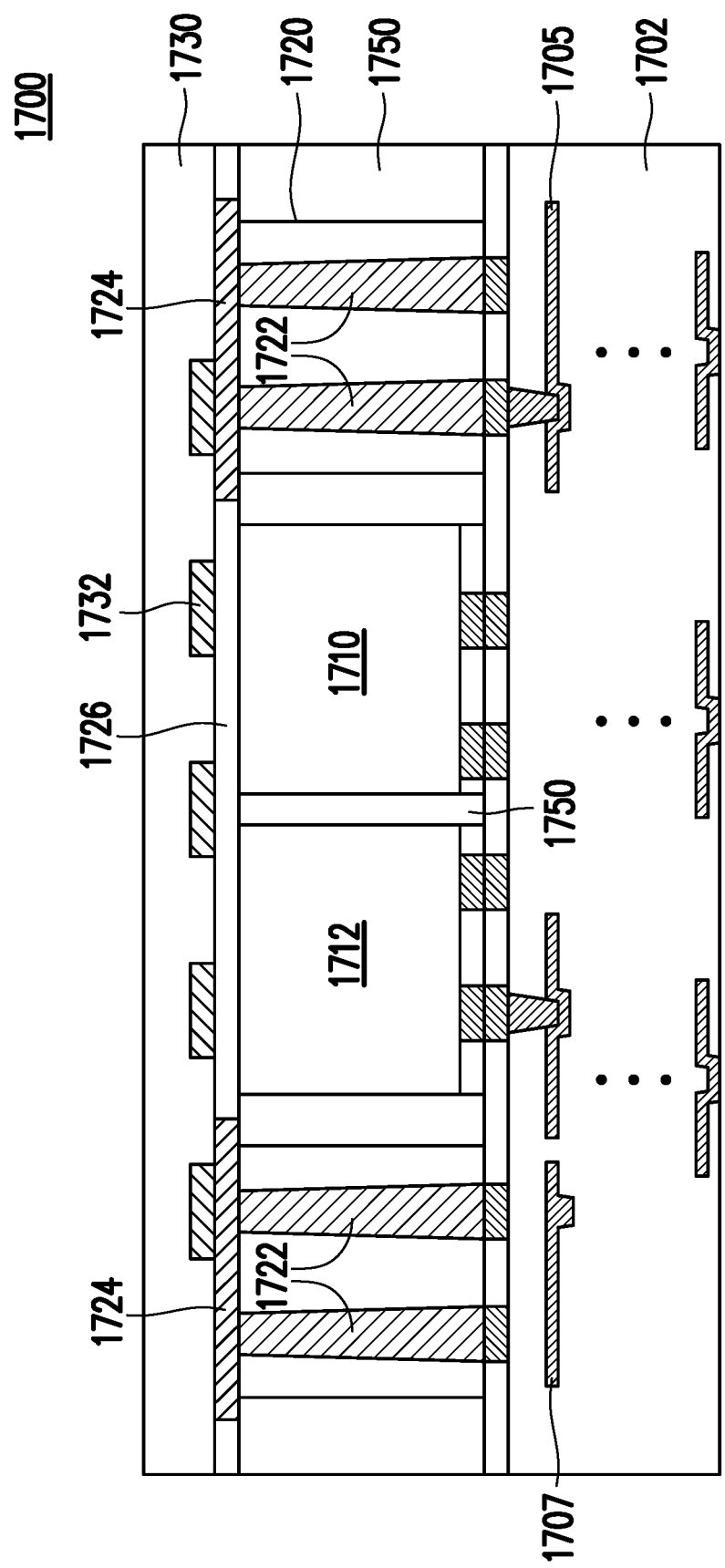
FIG. 17 is a schematic cross-sectional view of a semiconductor package according to some embodiments of the present disclosure.

FIG. 17 is a schematic cross-sectional view of a semiconductor package according to some embodiments of the present disclosure. In some embodiments, the package structure 1700 is similar to the structure described in the previous embodiments and in FIG. 13, the substrate 1702 is similar to the substrate 102, the frame structure 1720 is similar to the frame structure 200/200A, and the cover structure 1730 is similar to the cover structure 300/300A. As seen in FIG. 17, two semiconductor dies 1710 and 1712 are enclosed by the semiconductor frame structure 1720, and the semiconductor dies 1710 and 1712 may be different types of dies or perform different functions. In some embodiments, the semiconductor dies 1710 and 1712 are disposed side-by-side on the substrate 1702 and are bonded to the substrate 1702, and the semiconductor dies 1710 and 1712 are electrically connected with the substrate 102 through the wirings 1707. As seen in FIG. 17, the semiconductor dies 1710 and 1712 are laterally wrapped by the filling material 1750. In some embodiments, a dielectric layer 1726 is located between the semiconductor cover structure 1730 and the semiconductor frame structure 1720 and metal pads 1724 are embedded in the dielectric layer 1726. In some embodiments, the metal pads 1724 are bonded to the above grid pattern 1732 and the underlying vias 1722. In one embodiment, one metal pad 1724 is bonded to multiple vias 1722. In some embodiments, due to the TSV processing conditions, the vias 1722 are shown to have slant sidewalls. In some embodiments, the grid pattern 1732 together with the metal pads 1724, the vias 1722 form an EMI shielding structure and are electrically connected to the ground plate 1705 in substrate 1702.

In some embodiments of the present disclosure, a semiconductor package is provided. The semiconductor package includes a substrate, at least one semiconductor die, a semiconductor frame structure, a semiconductor cover structure and conductive balls. The substrate has a first surface and a second surface opposite to the first surface, and a ground plate embedded in the substrate. The semiconductor die is disposed on the first surface of the substrate and electrically connected with the substrate. The semiconductor frame structure is disposed on the substrate and surrounds the at least one semiconductor die. The semiconductor frame structure includes a plurality of conductive through semiconductor vias (TSVs) penetrating through the semiconductor frame structure, and at least one conductive TSV of the plurality of conductive TSVs is electrically connected with the ground plate. The semiconductor cover structure is disposed on the semiconductor frame structure and on the at least one semiconductor die. The semiconductor cover structure includes a conductive grid pattern and the conductive grid pattern contacts the plurality of conductive TSVs. The conductive balls are disposed on the second surface of the substrate and electrically connected with the at least one semiconductor die through the substrate.

In some embodiments of the present disclosure, a semiconductor package is provided. The semiconductor package includes a substrate, a semiconductor die, a semiconductor frame structure, a semiconductor cover structure and conductive balls. The substrate has a ground plate embedded in the substrate. The semiconductor die is disposed on the substrate and electrically connected with the substrate. The semiconductor frame structure is disposed on the substrate and beside the semiconductor die. The semiconductor frame structure includes a semiconductor body portion and a plurality of conductive through semiconductor vias (TSVs) penetrating through the semiconductor body portion. The semiconductor cover structure is disposed on the semiconductor frame structure and on the semiconductor die. The semiconductor cover structure includes a semiconductor main body portion and a conductive grid pattern inlaid in the semiconductor main body portion. The conductive grid pattern is connected with the plurality of conductive TSVs, and the conductive grid pattern and the plurality of conductive TSVs connected to the conductive grid pattern are electrically grounded through the substrate. The conductive balls are disposed on the substrate and electrically connected with the semiconductor die through the substrate.

In some embodiments of the present disclosure, a manufacturing method of a semiconductor package is provided. The manufacturing method includes the following steps. A substrate and a semiconductor die are provided. The semiconductor die is mounted and bonded to a mounting surface of the substrate. A semiconductor frame structure is connected to the mounting surface of the substrate and surrounds the semiconductor die. The semiconductor frame structure includes a plurality of conductive through semiconductor vias (TSVs). A semiconductor cover structure having a conductive grid pattern is mounted onto the semiconductor frame structure and the conductive grid pattern is connected with the plurality of conductive TSVs in the semiconductor frame structure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor package, comprising:
a substrate having a first surface and a second surface opposite to the first surface, and a ground plate embedded in the substrate;
at least one semiconductor die, disposed on the first surface of the substrate and electrically connected with the substrate;
a semiconductor frame structure, disposed on the substrate and surrounding the at least one semiconductor die, wherein the semiconductor frame structure includes a semiconductor body portion, a through hole penetrating through the semiconductor body portion, and a plurality of conductive through semiconductor vias (TSVs) penetrating through the semiconductor frame structure, the at least one semiconductor die is accommodated within the through hole and is spaced apart from a sidewall of the through hole with a distance, and at least one conductive TSV of the plurality of conductive TSVs is electrically connected with the ground plate;
a semiconductor cover structure, disposed on the semiconductor frame structure and on the at least one semiconductor die, wherein the semiconductor cover structure includes a conductive grid pattern and the conductive grid pattern contacts the plurality of conductive TSVs; and
conductive balls, disposed on the second surface of the substrate and electrically connected with the at least one semiconductor die through the substrate.

2. The semiconductor package of claim 1, wherein the plurality of conductive TSVs is located beside and around the at least one semiconductor die and the through hole.

3. The semiconductor package of claim 2, wherein an air gap exists between the at least one semiconductor die and the sidewall of the through hole of the semiconductor frame structure.

4. The semiconductor package of claim 2, further comprising a filling material disposed within the through hole and located between the at least one semiconductor die and the sidewall of the through hole of the semiconductor frame structure.

5. The semiconductor package of claim 2, wherein the plurality of conductive TSVs penetrates through the semiconductor body portion and is exposed from the semiconductor body portion.

6. The semiconductor package of claim 1, wherein the semiconductor cover structure includes a semiconductor main body portion, and the conductive grid pattern is inlaid in the semiconductor main body portion without penetrating through the semiconductor main body portion.

7. The semiconductor package of claim 1, wherein the substrate includes contact pads and the plurality of conductive TSVs is connected with the contact pads.

8. The semiconductor package of claim 1, wherein the plurality of conductive TSVs includes a metal material.

9. A semiconductor package, comprising:
a substrate having a ground plate embedded in the substrate;
a semiconductor die, disposed on the substrate and electrically connected with the substrate;
a semiconductor frame structure, disposed on the substrate and beside the semiconductor die, wherein the semiconductor frame structure includes a semiconductor body portion and a plurality of conductive through semiconductor vias (TSVs) penetrating through the semiconductor body portion;
a semiconductor cover structure, disposed on the semiconductor frame structure and on the semiconductor die, wherein the semiconductor cover structure includes a semiconductor main body portion and a conductive grid pattern inlaid in the semiconductor main body portion, and the conductive grid pattern is connected with the plurality of conductive TSVs, and the conductive grid pattern and the plurality of conductive TSVs connected to the conductive grid pattern are electrically grounded through the substrate; and
conductive balls, disposed on the substrate and electrically connected with the semiconductor die through the substrate,
wherein a gap exists between the semiconductor die and a sidewall of the semiconductor frame structure facing the semiconductor die and between the substrate and the semiconductor cover structure.

10. The semiconductor package of claim 9, wherein a spreading span of the semiconductor cover structure is larger than an area of the semiconductor frame structure.

11. The semiconductor package of claim 9, wherein a spreading span of the semiconductor cover structure is substantially equivalent to a spreading span of the semiconductor frame structure.

12. The semiconductor package of claim 9, wherein the plurality of conductive TSVs includes a first metal material, and the conductive grid pattern includes a second metal material.

13. The semiconductor package of claim 9, wherein the semiconductor frame structure includes a plurality of blocks, and the plurality of blocks are connected to form a ring-shaped frame structure surrounding the semiconductor die.

14. The semiconductor package of claim 9, further comprising a filling material disposed between the semiconductor die and the sidewall of the semiconductor frame structure facing the semiconductor die and between the substrate and the semiconductor cover structure.

15. A semiconductor package, comprising:
a substrate having a ground plate embedded in the substrate;
a semiconductor die, disposed on the substrate and electrically connected with the substrate;

a semiconductor frame structure, disposed on the substrate and beside the semiconductor die, wherein the semiconductor frame structure includes semiconductor block portions and metallic through semiconductor vias (TSVs) penetrating through the semiconductor block portions;

an insulating filling material laterally wrapping the semiconductor block portions of the semiconductor frame structure and the semiconductor die;

a semiconductor cover structure, disposed on the semiconductor frame structure and on the semiconductor die, wherein the semiconductor cover structure includes a semiconductor body portion and a metallic grid pattern inlaid in the semiconductor body portion, and the metallic grid pattern is connected with the metallic TSVs, and the metallic grid pattern and the metallic TSVs connected to the metallic grid pattern are electrically grounded through the substrate; and conductive balls, disposed on the substrate and electrically connected with the semiconductor die through the substrate.

16. The package of claim 15, wherein a material of the metallic TSVs is different from a material of the metallic grid pattern.

17. The package of claim 15, wherein the metallic TSVs include first metallic vias of a first size and second metallic vias of a second size different from the first size.

18. The package of claim 15, wherein the metallic TSVs are connected with the metallic grid pattern and are electrically connected to the ground plate through contact pads in the substrate.

19. The package of claim 17, wherein the metallic TSVs are interlinked with one another to form a chain wall structure.

20. The semiconductor package of claim 13, wherein the plurality of conductive TSVs includes first metallic vias of a first size and second metallic vias of a second size different from the first size.

* * * * *